United States Patent
Haebler et al.

(10) Patent No.: US 10,338,113 B2
(45) Date of Patent: *Jul. 2, 2019

(54) AUTHENTICATION, AUTHORIZATION, AND/OR ACCOUNTING OF POWER-CONSUMING DEVICES

(71) Applicant: Comcast Cable Communications, LLC, Philadelphia, PA (US)

(72) Inventors: Marcus Haebler, Audubon, PA (US); Chad Frederick, Harleysville, PA (US)

(73) Assignee: Comcast Cable Communications, LLC, Philadelphia, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/716,697

(22) Filed: Sep. 27, 2017

(65) Prior Publication Data

US 2018/0210017 A1 Jul. 26, 2018

Related U.S. Application Data

(63) Continuation of application No. 14/840,597, filed on Aug. 31, 2015, now Pat. No. 9,804,210.

(51) Int. Cl.
 *H02J 7/00* (2006.01)
 *G01R 21/133* (2006.01)

(52) U.S. Cl.
 CPC .......... *G01R 21/133* (2013.01); *H02J 7/0003* (2013.01); *H02J 2007/0001* (2013.01); *H02J 2007/0096* (2013.01)

(58) Field of Classification Search
 CPC ............ G01R 21/133; H02J 2007/0001; H02J 2007/0096; H02J 7/0003

USPC ....................................................... 320/139
 See application file for complete search history.

(56) References Cited

U.S. PATENT DOCUMENTS

| 6,211,581 | B1 | 4/2001 | Farrant |
| 7,399,205 | B2 | 7/2008 | McNeely et al. |
| 7,695,310 | B1 | 4/2010 | Boyer et al. |
| 8,145,361 | B2 | 3/2012 | Forbes, Jr. et al. |
| 8,396,606 | B2 | 3/2013 | Forbes, Jr. et al. |

(Continued)

FOREIGN PATENT DOCUMENTS

WO 2011021973 A1 2/2011

OTHER PUBLICATIONS

"Wireless Charging & How Wireless Chargers Work", PowerbyProxi, retrieved Mar. 9, 2015 from <http//powerbyproxi.com/wireless-charging/>.

(Continued)

*Primary Examiner* — Sun J Lin
(74) *Attorney, Agent, or Firm* — Banner & Witcoff, Ltd.

(57) ABSTRACT

Systems and methods for authenticating, authorizing, and/or accounting for a power-consuming device to access a power source are described. A power access controller can manage the power source and authenticate and/or authorize the power-consuming device to access the power source based on, for example, a power profile of the power-consuming device. The power profile can indicate categories of devices for the power-consuming device, the manufacturer of the power-consuming device, and/or the device's expected power consumption. Accounting of an amount of power consumed by the power-consuming device can also be performed.

14 Claims, 5 Drawing Sheets

(56) References Cited

U.S. PATENT DOCUMENTS

| | | | |
|---|---|---|---|
| 8,450,874 | B2 | 5/2013 | Ratcliff et al. |
| 8,930,736 | B2 | 1/2015 | James |
| 8,938,322 | B2 | 1/2015 | Westergaard |
| 8,996,183 | B2 | 3/2015 | Forbes, Jr. |
| 8,996,188 | B2 | 3/2015 | Frader-Thompson et al. |
| 9,130,402 | B2 | 9/2015 | Forbes, Jr. |
| 9,207,698 | B2 | 12/2015 | Forbes, Jr. |
| 9,804,210 | B2 * | 10/2017 | Haebler et al. ...... G01R 21/133 |
| 2009/0133733 | A1 | 5/2009 | Retti |
| 2011/0213983 | A1 | 9/2011 | Staugaitis et al. |
| 2011/0292869 | A1 | 12/2011 | Krieter |
| 2012/0173418 | A1 | 7/2012 | Beardsmore et al. |
| 2012/0274441 | A1 | 11/2012 | Birchbauer et al. |
| 2012/0326503 | A1 | 12/2012 | Birkelund |
| 2013/0198551 | A1 | 8/2013 | Marlin et al. |
| 2015/0372485 | A1 | 12/2015 | Borean et al. |

OTHER PUBLICATIONS

"Design of Industrial Power Distribution Systems: Shortcut Methods, Quick Estimation and Application Guidelines", P. K. Sen, NEI Electric Power Engineering, Inc., 2012.

"What is Power Line Communication?", EE Times, Aug. 17, 2011, retrieved from <http://www.eetimes.com/document.asp?doc_id=1279014&print=yes>.

"What Is HLR and VLR and Its Function in GSM", Teletopix, retrieved Mar. 24, 2015 from <http://teletopix.org/gsm/what-is-hir-and-vir-and-its-function-in-gsm/>.

"Network Authentication, Authorization, and Accounting: Part One", Sean Convery, The Internet Protocol Journal (vol. 10, No. 1—Cisco Systems), retrieved Mar. 24, 2015.

"An Access Control Protocol, Sometimes Called TACACS", C. Finseth, Jul. 1993, retrieved from <https://tools.ietf.org/html/rfc1492>.

"Remote Authentication Dial in User Service (RADIUS)", C. Rigley et al., The Internet Society, Jun. 2000, retrieved from <https://tools.ietf.org/html/rfc2865>.

"RADIUS Accounting", C. Rigney, The Internet Society, Jun. 2000, retrieved from <https://tools.ietf.org/html/rfc2866>.

"What is a RADIUS Server?", Cloudessa, retrieved Mar. 24, 2015 from <http://cloudessa.com/products-radius-service/what-is-a-radius-server/>.

"TACACS (Terminal Access Controller Access Control System)", Margaret Rouse, TechTarget, retrieved Mar. 24, 2015 from http://searchsecurity.techtarget.com/definition/TACACS>.

"What TLS/SSL?", Microsoft, Mar. 28, 2003, retrieved from <https://technet.microsoft.com/en-us/library/cc784450(d=printer,v=ws/10).aspx>.

* cited by examiner

AUTHENTICATION, AUTHORIZATION, AND/OR ACCOUNTING OF POWER-CONSUMING DEVICES

CROSS-REFERENCE TO RELATED APPLICATIONS

This application is a continuation of pending U.S. patent application Ser. No. 14/840,597, filed Aug. 31, 2015 and entitled "Authentication, Authorization, and/or Accounting of Power-Consuming Devices." The prior application is incorporated herein by reference in its entirety.

BACKGROUND

Power outlets and chargers are often accessible to the public. For example, chargers may be located in a public garage, or power outlets may be located on the outside of a home. Because these outlets and chargers are accessible to the public, power may be taken by any device without first performing authentication or authorization. Moreover, accounting of the power consumed by these devices may be difficult.

SUMMARY

This summary is not intended to identify critical or essential features of the disclosures herein, but instead merely summarizes certain features and variations thereof. Other details and features will also be described in the sections that follow.

A method described herein may comprise receiving, from a power-consuming device, a power profile indicating an expected power consumption of the power-consuming device. The expected power consumption may comprise at least one of a rated power consumption and a historical power consumption of the power-consuming device. It may be determined whether the expected power consumption of the power-consuming device exceeds a threshold power consumption. If the expected power consumption of the power-consuming device does not exceed the threshold power consumption, access to a power source may be granted to the power-consuming device. One or more embodiment described herein may be performed by at least one of a power outlet and a charger, and receiving the power profile may be performed in response to the power-consuming device being connected to the at least one of the power outlet and the charger.

The power profile may indicate a manufacturer of the power-consuming device. Moreover, the method may comprise determining whether devices manufactured by the manufacturer of the power-consuming device are authorized to access the power source. Granting the power-consuming device access to the power source may be performed in response to determining that the expected power consumption of the power-consuming device does not exceed the threshold power consumption and in response to determining that devices manufactured by the manufacturer of the power-consuming device are authorized to access the power source.

The power profile may indicate a category of the power-consuming device. Moreover, the method may comprise determining whether devices categorized in the category of the power-consuming device are authorized to access the power source. Granting the power-consuming device access to the power source may be performed in response to determining that the expected power consumption of the power-consuming device does not exceed the threshold power consumption and in response to determining that devices categorized in the category of the power-consuming device are authorized to access the power source.

In some aspects, the method may comprise determining, based on the expected power consumption of the power-consuming device, whether a circuit of the power source would be overloaded if the power-consuming device is granted access to the power source. Granting the power-consuming device access to the power source may be performed in response to determining that the expected power consumption of the power-consuming device does not exceed the threshold power consumption and in response to determining that the circuit of the power source would not be overloaded if the power-consuming device is granted access to the power source.

After the power-consuming device is granted access to the power source and in response to determining that a power consumption of the power-consuming device exceeds the expected power consumption of the power-consuming device by a second threshold power consumption, access to the power source may be denied.

The method may also comprise authenticating the power-consuming device. Prior to authenticating the power-consuming device, a pulse may be provided to the power-consuming device. The pulse may be configured to initiate the authenticating. Granting the power-consuming device access to the power source may be performed in response to determining that the expected power consumption of the power-consuming device does not exceed the threshold power consumption and in response to authenticating the power-consuming device.

A method described herein may comprise sending, by a power-consuming device and to a computing device, a power profile indicating an expected power consumption of the power-consuming device. In response to receiving an indication from the computing device that the power-consuming device has been granted access to a power source based on the expected power consumption of the power-consuming device, the power-consuming device may access the power source. In some aspects, the computing device may comprise at least one of a power outlet and a charger, and sending the power profile may be performed in response to the power-consuming device being connected to the at least one of the power outlet and the charger.

The power profile may indicate a manufacturer of the power-consuming device. Moreover, the power-consuming device accessing the power source may be performed in response to receiving the indication from the computing device that the power-consuming device has been granted access to the power source based on the expected power consumption of the power-consuming device and based on a determination that devices manufactured by the manufacturer of the power-consuming device are authorized to access the power source.

The power profile may indicate a category of the power-consuming device. Moreover, the power-consuming device accessing the power source may be performed in response to receiving the indication from the computing device that the power-consuming device has been granted access to the power source based on the expected power consumption of the power-consuming device and based on a determination that devices categorized in the category of the power-consuming device are authorized to access the power source.

In some aspects, the power-consuming device may access the power source in response to receiving the indication from the computing device that the power-consuming device has been granted access to the power source based on the expected power consumption of the power-consuming device and based on a determination that a circuit of the power source would not be overloaded if the power-consuming device is granted access to the power source.

After the power-consuming device accesses the power source, the power-consuming device may send to the computing device a present power consumption of the power-consuming device. The power-consuming device may receive an indication from the computing device that the power-consuming device has been denied access to the power source based on a determination that the present power consumption of the power-consuming device exceeds the expected power consumption of the power-consuming device by a second threshold power consumption.

The method may also comprise authenticating the power-consuming device. For example, in response to the power-consuming device receiving a pulse from the computing device, the power-consuming device may initiate an authentication session.

A power-consuming device described herein may comprise a processor, a power supply, and memory storing computer-executable instructions. When the instructions are executed by the processor, the power-consuming device may receive a charge pulse from a power access controller. The power-consuming device may charge the power supply using the charge pulse. The charged power supply may authenticate or authorize the power-consuming device to access a power source managed by the power access controller. The memory may store additional computer-executable instructions that, when executed by the processor, cause the power-consuming device to access the power supply responsive to receiving a message indicating that the power-consuming device is authenticated or authorized to access the power source. In some aspects, the power-consuming device may send, to the power access controller, a message indicating that a charge level of the power supply of the power-consuming device is below a threshold charge level. The power-consuming device may receive a second charge pulse from the power access controller.

The foregoing methods and other methods described herein may be performed by a system, a computing device, a computer readable medium storing computer-executable instructions for performing the methods, and/or an apparatus having a processor and memory storing computer-executable instructions for performing the methods.

BRIEF DESCRIPTION OF THE DRAWINGS

Some features herein are illustrated by way of example, and not by way of limitation, in the figures of the accompanying drawings and in which like reference numerals refer to similar elements.

DETAILED DESCRIPTION

Figure 1:
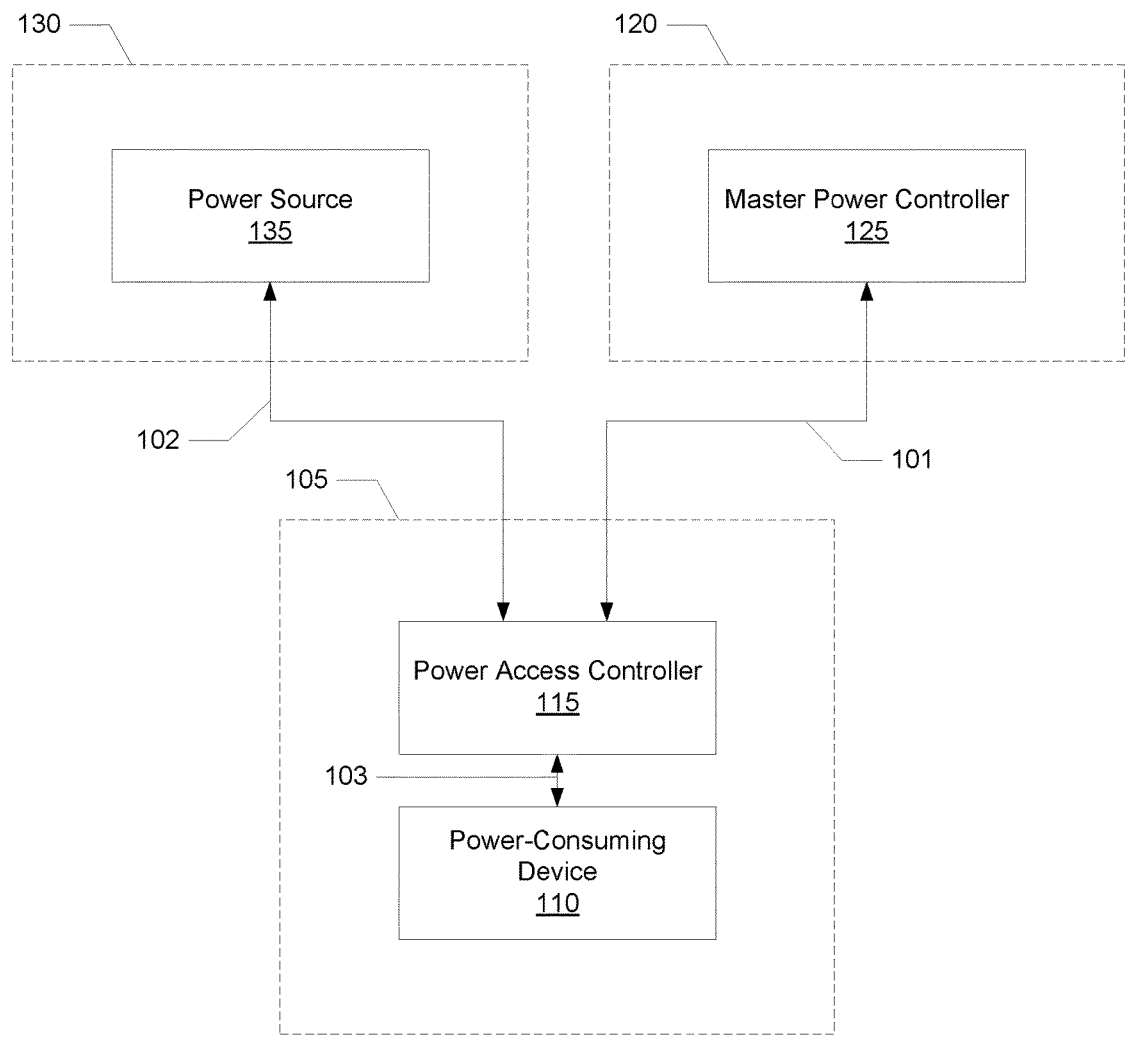
FIG. 1 illustrates an example network of devices according to one or more illustrative aspects of the disclosure.

FIG. 1 illustrates an example network of devices 100 according to one or more illustrative aspects of the disclosure. The network 100 may be any type of information and power distribution network, and information may be communicated between the devices via satellite, telephone, cellular, wireless, power line communication, etc. One example may be an optical fiber network, a coaxial cable network or a hybrid fiber/coax (HFC) distribution network. Another example may be a power transmission and distribution network having power line communication capabilities. Such networks 100 may use power/communication links 101, 102, and 103 (e.g., coaxial cables, optical fibers, wireless connections, power line networks, etc.) to connect devices at multiple locations, such as a first location 105, a second location 120, and/or a third location 130.

The first location 105 may include a power access controller 115 (e.g., a power outlet, an adapter that can be plugged into the power outlet, a wired charger, a wireless charger for inductive or wireless charging, etc.) for providing (or granting access to) power to power-consuming devices 110. The first location 105 may comprise a home, a business location, an airport, a vehicle charging station, a battery charging station, a parking garage or parking lot, and the like. The power access controller 115 may be integrated into the power outlet or charger. For example, the controller 115 may be built into a building's power supply or power outlet and be used to control access to the power supply or outlet. Alternatively, the power access controller 115 may be a device separate from the power supply or power outlet. For example, the controller 115 may comprise an adapter (e.g., expander) and be plugged into the power outlet.

The power-consuming device 110 may comprise a mobile phone, a tablet, a laptop, a desktop computer, a vehicle, a thermostat, a household appliance, a television, or any other electronic device that consumes power. The device 110 may be electrically connected to the power access controller 115 via a wire or wireless connection 103. The connection 103 may be used to communicate information between the power access controller 115 and the power-consuming device 110. The connection 103 may also be used to provide power to the power-consuming device 110 from (or via) the power access controller 115. In some aspects, the power provided to the power-consuming device 110 may be used to charge the power-consuming device's power supply, such as a battery or a capacitor. The power-consuming device 110 may include a client application used to authenticate and/or authorize the power-consuming device 110 to receive power from (or via) the power access controller 115 and/or to account for power consumed by the device 110. Examples of authentication, authorization, and accounting will be described in further detail below.

The network 100 may optionally include a second location 120 having a master power controller 125. The second location 120 may be a location different from the first location 105, such as a central office, a backend network, a headend, a billing system, and the like. The power access controller 115 may act as a gateway (e.g., router) between the power-consuming device 110 and the master power controller 125, and the master power controller 125 may be used to authenticate and/or authorize the power-consuming device 110 to access a power source and/or to account for the amount of power consumed by the power-consuming device 110 from the power source. The master power controller 125 may be used to manage multiple power access controllers 115 at the same location (e.g., the vehicle chargers at a parking garage or the outlets in a user's home) or different locations (e.g., one or more outlets in a user's home and one or more outlets in a neighbor's home).

As previously described, the master power controller 125 and the power access controller 115 may communicate over a wired or wireless connection 101. Exemplary wired connections include an in-band power line connection or a separate data connection, such as Ethernet, coaxial cable, optical fiber, etc. Exemplary wireless connections include Wi-Fi (e.g., 802.11x), ZigBee, Bluetooth, cellular, etc. If the power access controller 115 is used to authenticate, authorize, and/or perform accounting for the power-consuming device 110, the master power controller 125 might not be used for authentication, authorization, or accounting.

The network 100 may optionally include a third location 130 having a power source 135. The power source 135 may comprise an electric utility generation, transmission, and/or distribution facility. The power source 135 may provide electric power to the first location 105 via connection 102, and the power access controller 115 and/or power-consuming device 110 may have access to the electric power at the first location 105. If the power source that provides power to the power-consuming device 110 is integrated in the power access controller 115, the power source 135 might not be used and thus is optional.

Figure 2:
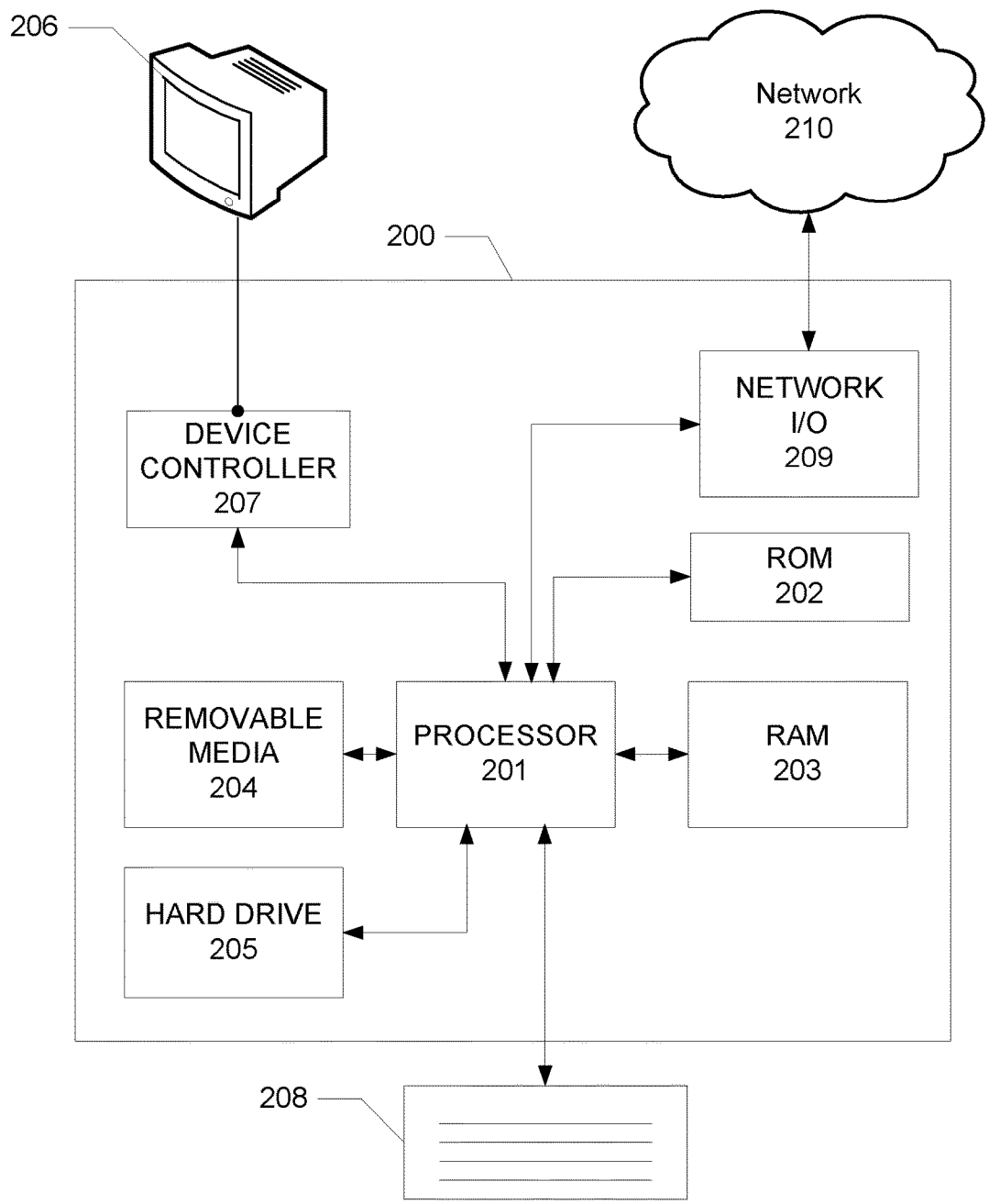
FIG. 2 illustrates an example hardware and software platform on which various elements described herein can be implemented.

FIG. 2 illustrates general hardware and software elements that can be used to implement any of the various devices discussed herein (e.g., power-consuming device 110, power access controller 115, master power controller 125, or power source 135). The computing device 200 may include one or more processors 201, which may execute instructions of a computer program to perform any of the features described herein. The instructions may be stored in any type of computer-readable medium or memory, to configure the operation of the processor 201. For example, instructions may be stored in a read-only memory (ROM) 202, random access memory (RAM) 203, hard drive, removable media 204, such as a Universal Serial Bus (USB) drive, compact disk (CD) or digital versatile disk (DVD), floppy disk drive, or any other desired electronic storage medium. Instructions may also be stored in an attached (or internal) hard drive 205. The computing device 200 may include one or more output devices, such as a display 206 (or an external television), and may include one or more output device controllers 207, such as a video processor. There may also be one or more user input devices 208, such as a remote control, keyboard, mouse, touch screen, microphone, etc.

The computing device 200 may also include one or more network interfaces 209, such as input/output circuits (such as a network card) to communicate with an external network 210 or other devices. The interface 209 may be a wired interface, wireless interface, or a combination of the two. In some embodiments, the interface 209 may include a modem (e.g., a cable modem), and the network 210 may include the communication links 101 or 102 discussed above, the external network 109, an in-home network, a provider's wireless, coaxial, fiber, or hybrid fiber/coaxial distribution system (e.g., a DOCSIS network), or any other desired network. The computing device 200 may communicate with the external networks 210 or other devices using one or more communication protocols, such as wired communication protocols and wireless communication protocols (e.g., Wi-Fi, Bluetooth, ZigBee, Z-Wave, etc.).

Figure 3:
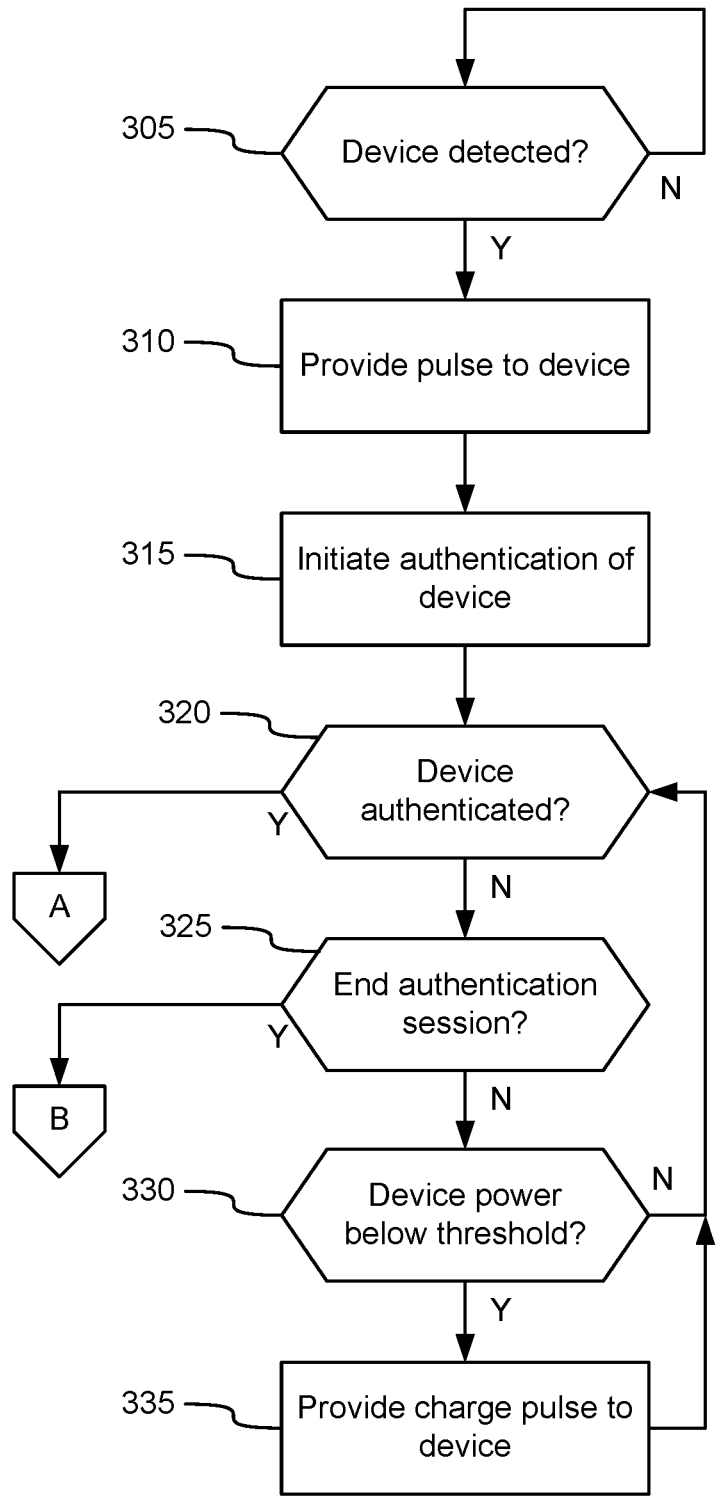
FIG. 3 illustrates an example method of authenticating a device attempting to access a power source according to one or more illustrative aspects of the disclosure.

FIG. 3 illustrates an example method of authenticating a power-consuming device 110 attempting to access a power source 135 according to one or more illustrative aspects of the disclosure. The steps described with respect to FIG. 3 may be performed by one or more computing devices, such as the power access controller 115, the master power controller 125, and/or the power source 135. As previously explained, the master power controller 125 and power source 135 are optional if the power access controller 115 is configured to authenticate and authorize connected power-consuming devices, account for power consumed by power-consuming devices, and to provide power to power-consuming devices.

Additionally or alternatively, the master power controller 125 may be configured to authenticate and/or authorized power-consuming devices to access power and/or to account for the power consumed. The power source 135 may be configured to provide power, such as AC or DC power, to the location 105, and the power access controller 115 may be configured to provide that power to power-consuming devices 110. The master power controller 125 may be configured to authenticate, authorize, and/or account for power-consuming devices' power consumption. For the sake of convenience, the steps described with respect to FIG. 3 will generally be described as being performed by the power access controller 115. However, the power access controller 115, the master power controller 125, and the power source 135 may be configured to work together to perform one or more of the steps described with respect to FIG. 3.

Initially, the power access controller 115 may prevent access to the power source 135 at the first location 105 (or an outlet or charger at the first location 105). For example, a power outlet might initially be turned off so that it does not supply power to devices plugged in to the outlet (e.g., a power-consuming device 110).

In step 305, the power access controller 115 may determine whether a power-consuming device 110 has been detected, such as if the device 110 has been plugged into a power outlet (or has been wirelessly connected to a wireless charger). If not (step 305: N), the power access controller 115 may wait until a device 110 has been detected in step 305. If a power-consuming device 110 has been detected (step 305: Y), the power access controller 115 may proceed to step 310.

In step 310, the power access controller 115 may provide a pulse to the device 110. The pulse may be used to initiate authentication of the device 110. In some aspects, the pulse may comprise a charge pulse, such as a low voltage (e.g., 5V) DC or AC charge used to charge a battery, capacitor, or other power supply in the device 110. The device 110 may use the received charge in the power supply for the authentication and/or authorization process. The charge pulse may be beneficial if the device 110 does not have a large power supply (e.g., a small capacitor), the power supply is completely discharged (e.g., the battery is discharged), or the power supply does not have enough charge to complete the authentication and/or authorization process.

In step 315, the power access controller 115 may initiate authentication of the device 110, or the device 110 may initiate an authentication session in response to receiving the pulse from the power access controller 115. During authentication, the device 110 may transmit an identifier, such as its credentials, Media Access Control (MAC) address, Internet Protocol (IP) address, International Mobile Station Equipment Identity (IMEI) number, manufacturer ID, serial number, or other unique identifier, to the power access controller 115. The power access controller 115 may forward the device's identifier to the master power controller 125, and the master power controller 125 may authenticate the device 110 using the received credentials. If mutual authentication is used, the power access controller 115 and/or master power controller 125 may also transmit its credentials to the device 110 for authentication. In the foregoing example, the master power controller 125 may authenticate the device 110, with the power access controller 115 acting as a gateway for exchanging information between the master power controller 125 and the device 110. In alternative aspects, the power access controller 115 may itself authenticate the device 110 without transmitting the device's identifier to the master power controller 125.

The authentication session may be secured (e.g., encrypted) using a conventional encryption technique, such as the Transport Layer Security (TLS) protocol, the Secure Sockets Layer (SSL) protocol, or asymmetric (public/private key pair) or symmetric encryption keys. As explained above, the information transmitted between the device 110, the power access controller 115, and the master power controller 125 may be via a wired or wireless connection. For example, if wired power line communication is used, the communication may use a one-wire serial communication protocol over the not yet hot lead.

In step 320, the power access controller 115 may determine whether the device 110 has been authenticated. If the device 110 has been authenticated (step 320: Y), the power access controller 115 may proceed to step 405 described with respect to FIG. 4 for authorization, which will be described in further detail in the examples below. If the device 110 has not been authenticated (step 320: N), the power access controller 115 may proceed to step 325.

In step 325, the power access controller 115 may determine whether to end the authentication session with the device 110. The power access controller 115 may end the authentication session if authentication cannot be completed, for example based on a timeout, if the power access controller 115 (or master power controller 125) cannot authenticate the device 110 based on the received credentials, etc. If the authentication session is to be ended (step 325: Y), the power access controller 115 may proceed to step 425 described with respect to FIG. 4 and deny the device 110 access to the power source 135.

The authentication steps described with respect to FIG. 3 may be used to secure outlets or chargers accessible to the public, such as a vehicle charger in a parking garage or a power outlet outside of a user's home. By authenticating (and authorizing) devices before granting access to the power source 135, theft of power might be prevented, and the owner or manager of the charger or outlet would not need to pay attention to the state of the publicly accessible charger or outlet. At the same time, authenticated (and authorized) devices may still access the power source 135 via the charger or outlet. For example, a user's neighbor may be permitted to use the user's outside outlet. Residents of an apartment complex above a parking garage may be permitted to use vehicle chargers in the parking garage.

Returning to FIG. 3, if the authentication session is not to be ended (step 325: N), the power access controller 115 may proceed to steps 330 and 335 to determine whether to provide a charge pulse to the device 110. Steps 330 and 335, as with all steps, are optional and might not be performed if the device 110 has its own power supply (e.g., a battery) or the power supply has enough power to complete authentication.

In step 330, the power access controller 115 may determine whether the device's power supply (e.g., a battery, capacitor, etc.) level is below a threshold. During authentication, the device 110 may notify the power access controller 115 if the level of its power supply is below the threshold. If the level is not below the threshold (step 330: N), the power access controller 115 may return to step 320 to determine whether the device 110 has been authenticated. If the level is below the threshold (step 330: Y), the power access controller 115 may proceed to step 335. The amount of power used to complete authentication may vary by device, and the threshold may be varied accordingly so that the device 110 will have enough power to complete authentication.

In step 335, the power access controller 115 may provide a charge pulse to the device 110. The device 110 may use the charge pulse to charge its power supply, which may be used to power the device 110 during authentication. The power access controller 115 may return to step 320 to determine whether the device 110 has been authenticated. In some aspects, instead of providing the device 110 with a charge pulse based on the level of charge, the power access controller 115 may periodically provide charge pulses to the device 110 (e.g., every 5 seconds) during authentication (or during authorization, as will be described below). Additionally or alternatively, the power access controller 115 may provide a charge pulse based on a timeout, such as if the power access controller 115 has not received communications from the device 110 for a threshold amount of time. Once the device 110 is authenticated (step 320: Y), the power access controller 115 may proceed to the steps described with respect to FIG. 4 for authorization of the device 110.

Figure 4:
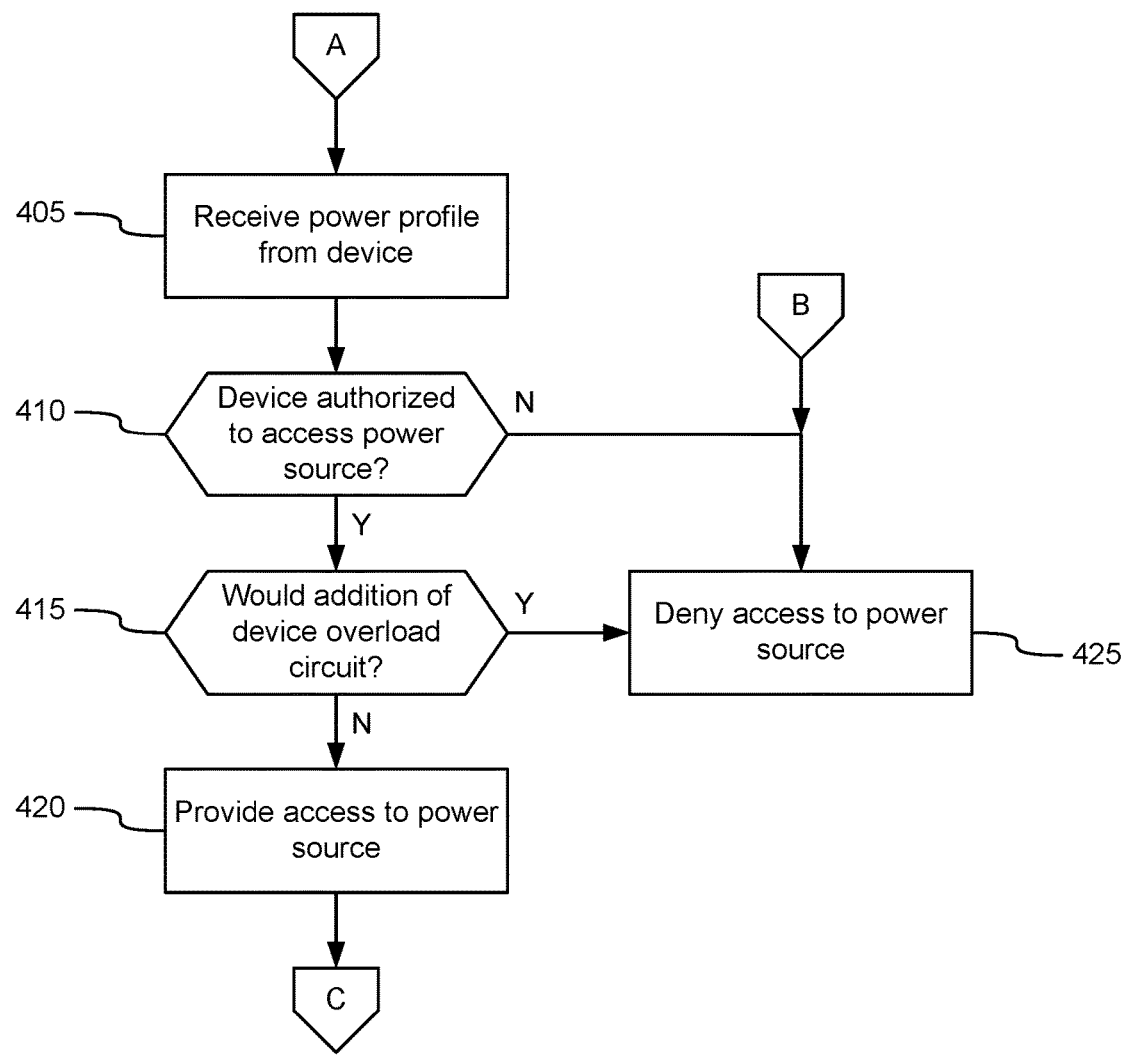
FIG. 4 illustrates an example method of authorizing a device attempting to access a power source according to one or more illustrative aspects of the disclosure.

FIG. 4 illustrates an example method of authorizing a power-consuming device 110 attempting to access a power source 135 according to one or more illustrative aspects of the disclosure. The steps described with respect to FIG. 4 may be performed by one or more computing devices, such as the power access controller 115, master power controller 125, and/or power source 135. For the sake of convenience, the steps described with respect to FIG. 4 will generally be described as being performed by the power access controller 115.

In step 405, the power access controller 115 may receive a power profile from the device 110. The power profile may comprise an identifier for the device 110, such as a network address (e.g., MAC address, IP address, etc.) or other device identifier (e.g., a manufacturer ID, device model name, serial number, certificate, etc.). The power profile may also identify the device's category or categories, such as household appliance, vehicle, mobile phone, mobile device, television, laptop computer, etc. For example, if the device 110 is a mobile phone, the power profile may identify the categories as mobile phone and mobile device. If the device 110 is a laptop computer, the power profile may identify the categories as laptop computer and mobile device. If the device 110 is a refrigerator, the power profile may identify the category as household appliance. The power profile may also identify the manufacturer of the device 110.

The power profile may also indicate the device's power consumption (e.g., expected power consumption, such as rated power consumption or historical power consumption). For example, the power profile may indicate the device's average power consumption (in Watts) over a period of time, such as 5 days. The power profile may also indicate the device's peak power consumption (e.g., in Watts), such as switch-on peak power consumption or maximum power consumption. The power profile may also indicate the power factor (e.g., power efficiency) of the device 110.

The power profile may indicate other operating parameters for the device 110. For example, the power profile may indicate the normal, minimum, and/or maximum operating voltages for the device 110 or a component in the device 110, such as a power supply. The power profile may indicate voltage and/or current tolerances for the device 110 or a component in the device 110, such as over-voltage tolerance, under-voltage tolerance, and over-current tolerance. If the device 110 has its own protective device (e.g., a breaker or a fuse) the power profile may include information on a protective device. For example, the power profile may indicate the fuse or breaker type, fuse or breaker rating (e.g., in volts and/or amps), status of the fuse (e.g., operational, triggered, should be replaced, etc.). The power profile may also indicate whether the power supply of the device 110 supports AC and/or DC power. If the device 110 supports AC power, the power profile may indicate the frequencies supported (e.g., 50 Hz, 60 Hz, etc.) and/or the voltages supported (e.g., 110 V, 230 V, etc.). The power profile may include tolerances for any of the following: line noise immunity for a DC-powered device 110 (units may be in, e.g., milliseconds), cycle drops for an AC-powered device 110 (units may be in, e.g., milliseconds), interruptions for a DC-powered device (units may be in, e.g., milliseconds), voltage dip, and/or heat dissipation rating (units may be in, e.g., British thermal unit or BTU).

In some aspects, the power access controller 115 may retrieve, from a database, any information that is missing in the device's power profile. For example, the power access controller 115 may use the rated power consumption of the device 110 to determine whether to authorize the device 110 to access the power source 135 (in steps 410 and 415, as will be described below). However, the power profile for the device 110 might not have included the rated power consumption of the device 110. In this example, the power access controller 115 may use other information provided by the device 110 to determine the missing information. For example, the power access controller 115 may query a database, such as a manufacturer's database, with information identifying the device 110 (e.g., the serial number, IMEI, device model and number, etc.) and a request for the missing information. In response, the database may send the requested information, such as the rated power consumption of the device 110, to the power access controller 115.

In step 410, the power access controller 115 may determine whether the device 110 should be authorized to access the power source 135 based on the received power profile. In alternative aspects, the power access controller 115 may send the device power profile to the master power controller 125, and the master power controller 125 may determine whether to authorize the device 110 based on the received power profile.

Authorization may be based on the identity of the manufacturer of the device 110. The power access controller 115 may store or have access to a stored list of manufacturers authorized to access the power source 135. For example, Manufacturer A and Manufacturer B may be on the list of authorized manufacturers, whereas Manufacturer C might not be on the list. If the power access controller 115 determines that device 110 was manufactured by Manufacturer A or Manufacturer B (e.g., based on an identifier provided by the device 110 during an authentication or authorization session), the power access controller 115 may determine that device 110 is authorized to access the power source 135 (step 410: Y). On the other hand, if the device 110 was manufactured by Manufacturer C, the power access controller 115 may determine that device 110 is not authorized to access the power source 135 (step 410: N).

Authorization may additionally or alternatively be based on the category or categories of the device 110. For example, mobile devices may be authorized to access the power source 135, whereas household appliances might not be authorized to access the power source 135. Authorization may additionally be based on the location 105 of the power access controller 115 (and device 110). For example, the power access controller 115 may be located inside of an airport, such as within one of the airport terminals. The power access controller 115 may permit devices categorized as mobile phones, mobile devices, and laptop computers to access the power source 135 within the airport. On the other hand, the power access controller 115 might prevent household appliances, vehicles, and televisions from accessing the power source 135 within the airport. If the power access controller 115 is located in a garage of the airport, the controller 115 may grant access to vehicles, mobile phones, mobile devices, and laptop computers, but deny access to household appliances and televisions. If the power access controller 115 is located in a home, the controller 115 may grant access to mobile phones, mobile devices, laptop computers, household appliances, and televisions.

Authorization may additionally or alternatively be based on the expected power consumption of the device 110 being below a threshold consumption. The power access controller 115 may store or have access to stored thresholds for average power consumption, peak power consumption, and maximum power consumption. If the device's power profile indicates that the device's power consumption exceeds one, two, or all three of these thresholds, the controller 115 may determine that device 110 is not authorized to access the power source 135 (step 410: N). Otherwise, the power access controller 115 may determine that the device 110 is authorized to access the power source 135 (step 410: Y). For example, assume that a threshold for peak power consumption is 105 watts. Assume the device 110 comprises a laptop computer, and the power profile for the laptop indicates that the peak power consumption for the laptop is 100 watts. In this example, the power access controller 115 may determine that the laptop computer 110 is authorized to access the power source 135 because the peak power consumption of the laptop is less than the threshold (step 410: Y). In some aspects, authorization may be used for circuit overload protection based on current power consumption, as will be described below in reference to step 415.

Authorization may additionally or alternatively be based on any of the operating parameters included in the power profile or retrieved from a database (e.g., operating voltages and/or currents, fuse or breaker information, frequencies and/or voltages supported by the device 110, etc.). For example, if the device's operating voltage (e.g., 5V) exceeds a threshold operating voltage (e.g., 4V), the controller 115 may determine that device 110 is not authorized to access the power source 135 (step 410: N). If the device's power profile indicates that the device 110 does not support DC power, and the power source 135 is a DC power source, the controller 115 may determine that device 110 is not authorized to access the power source 135 (step 410: N). If the device's power profile indicates that the device 110 supports up to 120V AC power, and the power source 135 is a 230V AC power source, the power access controller 115 may determine that device 110 is similarly not authorized to access the power source 135 (step 410: N). If the device's power profile indicates that the switch or fuse of the device 110 should be replaced, the controller 115 may determine that the device 110 is not authorized to access the power source 135 (step 410: N) until the switch or fuse is replaced. The above examples are merely exemplary, and any of the operating parameters described herein may be used to authorize the device 110 (or deny the device 110) to access the power source 135.

In step 415, the power access controller 115 may determine whether the addition of the device 110 to the power source 135 would overload the power supply circuit. For example, an overload may occur if a circuit breaker or switch is tripped. Overload may also occur if power consumption at a particular outlet or within the home exceeds a threshold consumption. The power access controller 115 may measure, in real time, the present power drawn from the power source 135, the power drawn by devices at the location 105, and/or power drawn at the particular power outlet or connection point for the device 110. The power access controller 115 may also determine the maximum or threshold power consumption for the power source 135, the location 105, and/or the particular outlet. Moreover (and as previously explained), the power access controller 115 may determine the expected average, peak, or maximum power consumption of the device 110 based on its power profile.

The threshold power consumption may be set to a rating of the circuit breaker or switch, such as the maximum power or current that the breaker can handle before it is tripped (e.g., a maximum power of 2.4 kilowatts, a maximum current of 40 Amps, etc.). The threshold may also be set to provide a margin (e.g., a safety margin) for the breaker or switch. For example, if the maximum power of the breaker is 2.4 kW, the threshold may be set to a value lower than 2.4 kW, such as 2 kW. As another example, if a 5% margin is used, the threshold may be set to 2.28 kW.

In some aspects, several power access controllers 115 may be grouped together and managed by a master power controller 125 or power source 135. The threshold power consumption may be a collective threshold power consumption for all of the power access controllers 115 in the group. For example, the collective threshold power consumption may be 10 kW. If four power access controllers 115 are in the group, the power access controllers 115 may each be assigned an equal threshold power consumption (e.g., 2.5 kW threshold). Alternatively, the assigned thresholds might not be equal. For example, the first two power access controllers 115 may each be assigned a 3 kW threshold, and the last two power access controllers 115 may each be assigned a 2 kW threshold. If the power access controllers 115 are at different locations, assigning the thresholds may be based on the type of each location. For example, a power access controller 115 at a commercial location, such as an airport terminal or parking garage, may be assigned a higher threshold, such as 3 kW. A power access controller 115 at a residential location, such as a home, may be assigned a lower threshold, such as 2 kW.

Using the above information, the power access controller 115 may determine whether providing the device 110 with access to the power source 135 would overload the power supply circuit. For example, the controller 115 may determine whether the power that the device 110 is expected to consume exceeds the available (e.g., spare) power on the power supply circuit. If so (step 415: Y), the power access controller 115 may deny, in step 425, the device 110 access to the power source 135. On the other hand, the power access controller 115, may provide (e.g., grant) the device 110 access to the power source 135 in step 420 if the power that the device 110 is expected to consume does not exceed the available power (step 415: N). Providing access to the power source may include closing a switch in the power access controller 115 and/or the device 110 to complete the power supply circuit. After granting access to the power source 135, the power access controller 115 may optionally switch communications between the controller 115 and device 110 from power line communication to another method of communication, such as wireless communication or a separate wired connection (e.g., Ethernet).

If the power access controller 115 denies the device 110 access to the power source 135, the controller 115 may determine whether there are any nearby power sources (or outlets/chargers) that the device 110 might be able to access. For example, additional outlets or chargers in the same room or in the same structure (but on different circuits) may be used. The controller 115 may display or use a speaker to notify the user of the device 110 of the alternative outlet or charger and its location. Additionally or alternatively, the controller 115 may send this information to the device 110 (via the connection 103 or a different wired or wireless connection), and the device 110 may display the location of the alternative outlet or charger. The power access controller 115 (or master power controller 125) may be connected to (e.g., hooked into) a message or event (e.g., bus) system to notify the user of the alternative outlet or charger. The message in this system may be sent to the device 110 via, for example, a text messaging service (e.g., SMS, MMS), email, etc. The message may additionally or alternatively be sent to another device, such as a device in the user's home automation system, such as a thermostat having a display and/or speaker. The power access controller 115, the device 110, or another device may have access to a map or blueprint of the location 105 (or nearby locations) to identify the alternative outlets and chargers.

Figure 5:
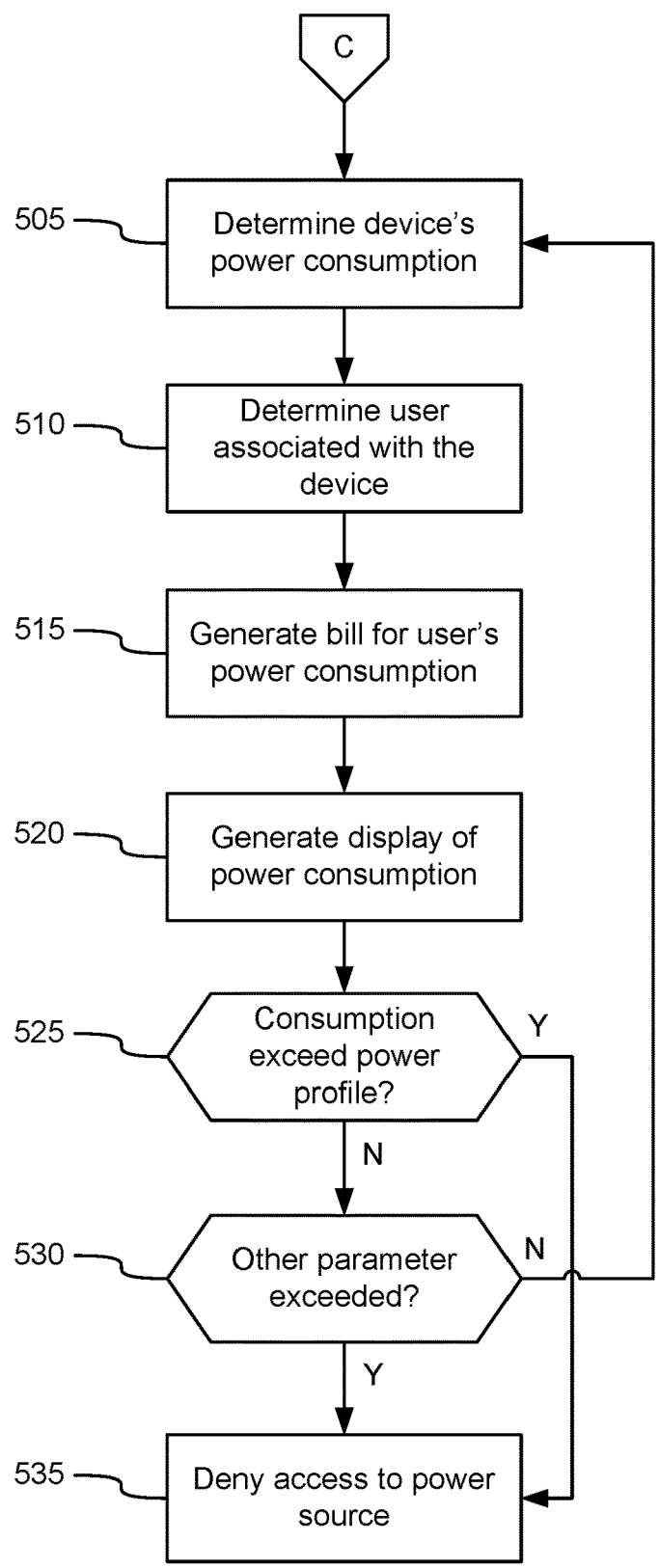
FIG. 5 illustrates an example method of accounting for a device accessing a power source according to one or more illustrative aspects of the disclosure.

FIG. 5 illustrates an example method of accounting of power usage for a power-consuming device 110 accessing a power source 135 according to one or more illustrative aspects of the disclosure. The steps described with respect to FIG. 5 may be performed by one or more computing devices, such as the power access controller 115, master power controller 125, and/or power source 135. For the sake of convenience, the steps described with respect to FIG. 5 will generally be described as being performed by the power access controller 115.

In step 505, the power access controller 115 may determine the device's power consumption. In general, any of the devices described with respect to FIG. 1 may determine the amount of power consumed by the device 110. For example, the device 110 may itself determine the amount of power drawn from the power source 135. The power source 135 may determine the amount of power the device 110 draws from the source 135. The power access controller 115 and/or master power controller 125 may determine the amount of power the device 110 consumes by measuring the amount of power coming from the power source 135 and/or the amount of power being sent to the device 110.

The amount of power consumed by the device 110 may be monitored over time, and information indicating the amount of power consumed may be generated. For example, as long as the power source 135 supplies power to the device 110, updates about the device's power consumption may be periodically submitted, such as to the master power controller 125 or the power access controller 115, for accounting purposes. The generated usage information may be used to bill a user associated with the device 110 and/or to generate a display of the device's power consumption.

In step 510, the power access controller 115 may determine a user associated with the device 110. During authentication and/or authorization, the device 110 may have sent to the power access controller 115 information identifying the user, such as a username, email address, billing address, credit card information, account number, or other information uniquely identifying the user. For example, the user identifier (e.g., an account number) may be associated with an account the user has with the owner, operator, or manager of the power source 135 or an account the user has for the device 110 (e.g., an Internet Service Provider (ISP) account, a mobile service provider, etc.). If the device 110 did not provide the user's information during authentication or authorization, the power access controller 115 may retrieve the information from a database storing information that correlates the device's identifier (e.g., IMEI, certificate, etc.) to a user. The database may be operated by the owner, operator, or manager of the power source 135 and/or an owner, operator, or manager of a service provided to the device 110 (e.g., mobile service provider, ISP, etc.).

In step 515, the power access controller 115 may generate a bill for the user for the device's power consumption. If the user has an account with the provider of the power source 135, the user's account may be directly billed (e.g., monthly or bi-monthly) for the amount of power consumed by the device 110 over the billing period. For example, if the user plugs the device 110 into an outlet at the user's home, the user's residential power provider account can be directly billed. Similarly, if the user plugs the device into an outlet at a neighbor's home and the neighbor uses the same residential provider, the user's account with the residential power provider can be directly billed.

If the user does not have an account with the power provider, a new bill for the amount of power consumed may be generated and sent (e.g., by physical mail or electronic communications, such as email) to the user. Additionally or alternatively, the bill may be sent to a third-party broker that oversees billing of power consumption for one or more power providers. The third-party broker may apply the bill to an account the user has with the broker. Using the billing method described herein, a user may plug in or otherwise charge a device 110 at any location, such as an airport, a parking lot, a friend's house, etc., and have the user's own account be billed for the power consumed.

In step 520, the power access controller 115 may generate a display of the device's power consumption and/or a display of the overall power consumption of devices at a particular location, such as the user's home, an airport, a parking garage with electric vehicle chargers, etc. The display may indicate the amount of power consumed by each device at a particular location, such as the user's home 105. The display may indicate the amount of power consumed by each category of device at the location 105. As previously described, categories include mobile device, household appliance, vehicle, etc. The display may also indicate the amount of power consumed by devices at the location 105 by manufacturer, such as the power consumption of devices manufactured by Manufacturer A, devices manufactured by Manufacturer B, and devices manufactured by Manufacturer C. The power access controller 115 may display the power consumption on a display, such as a display integrated in the controller 115, a display in the device 110 (e.g., a vehicle display or a mobile phone display), a television display (e.g., in the user's home), a computer display, etc. Accordingly, the aspects described herein may provide for power metering, analysis, and visualization. For example, the user may see the percentage of monthly power consumption or bill that each device, category of device, or manufacturer contributes to the overall monthly power consumption or bill.

Users may also receive credit for off-peak power consumption and/or charging. For example, users that charge or connect their devices between 1 AM and 5 AM may receive a credit or discount on their power bills. Moreover, a power provider may be permitted to manage and control power flow to individual devices across their network to manage the power grid while minimizing inconvenience to users.

In step 525, the power access controller 115 may determine whether the device's power consumption exceeds the expected power consumption identified in the device's power profile. If the device's consumption does not exceed the expected power consumption (step 525: N), the power access controller 115 may proceed to step 530.

In step 530, the power access controller 115 may determine whether another parameter in the device's power profile has been exceeded. As previously explained, other parameters may include normal, minimum, and/or maximum operating voltages, fuse or breaker type, fuse or breaker rating (e.g., in volts and/or amps), status of the fuse (e.g., operational, triggered, needs replacing, etc.), and the like. The other parameters may have been included in the device's power profile, or the power access controller 115 may have retrieved the other parameters from a database, such as a device manufacturer's database.

In one example, the power access controller 115 may determine whether the device's operating voltage has exceeded its maximum operating voltage indicated in the power profile. If so (step 530: Y), the power access controller 115 may proceed to step 535 to deny the device 110 access to the power source 135. As another example, the power access controller 115 may determine the status of a protection device of the device 110, such as a fuse or a breaker. If the fuse or breaker is operational, the power access controller 115 may continue to grant the device 110 access to the power source 135. On the other hand, if information from the device 110 indicates that the fuse or breaker should be replaced or has tripped, the power access controller 115 may prevent access to the power source 135. As yet another example, assume that DC power is being provided to the device 110. The power access controller 115 may monitor the level of noise in the circuit for the power supply 135. If the level of noise exceeds a threshold, such as the line noise immunity level for device 110, the power access controller 115 may deny access to the power source 135 in step 535. The above examples are non-limiting, and the power access controller 135 may monitor any of the operating parameters described herein and use the monitored parameter to determine whether to continue to provide power to the device 110 or to deny the device 110 access to power.

If the device's consumption exceeds the expected power consumption (step 525: Y) or another parameter in the power profile has been exceeded (step 530: Y), the power access controller 115, in step 535, may deny the device 110 access to the power source 135. For example, assume that the power profile of a laptop 110 indicated that the peak power consumption of the laptop is 100 watts. The power access controller 115 may grant the laptop 110 a tolerance of 5%, so that the laptop's peak power consumption can rise up to 105% before the power access controller 115 denies the laptop 110 access to the power source 135. The power access controller 115 may open a switch or otherwise break the circuit providing power to the device 110. The power access controller 115 may alternatively send an instruction to the device 110 to stop accessing the power source 135.

The device 110 can be prevented from accessing the power source 135 via other methods. For example, the user may send, from his or her mobile device, an instruction to the power access controller 115 or master power controller 125 to stop power from flowing to the device 110. The user's location may also be tracked (e.g., based on the location of one or more of the user's devices), and power can turned off when the user leaves the location 105. For example, power to the appliances 110 at the user's home 105 may be shut off if the user leaves the home 105. Power line communication may also be used to prevent access to the power source 135. For example, the master power controller 125 or power source 135 may send, via a power line, an instruction to the power access controller 115 to prevent the device 110 from accessing the power source 135. Similarly, the power access controller 115 may communicate with the device 110 via a power line and request the device 110 to stop accessing the power source 135. Power may shut off if the device 110 is disconnected from the power access controller 115.

The various features described above are merely non-limiting examples, and can be rearranged, combined, subdivided, omitted, and/or altered in any desired manner. For example, features of the computing device (including the remote control device and the terminal device) described herein can be subdivided among multiple processors and computing devices. The true scope of this patent should only be defined by the claims that follow.

We claim:

1. A method comprising:
    receiving, by a computing device and from a user device, a device profile associated with the user device;
    determining, by the computing device and based on the device profile associated with the user device, an expected power consumption of the user device;
    determining, by the computing device and based on the expected power consumption of the user device, whether the user device is authorized to access a power source; and
    granting, based on determining that the user device is authorized to access the power source, the user device access to the power source.

2. The method of claim 1, wherein the device profile associated with the user device indicates a device identifier of the user device, a manufacturer of the user device, or a category of the user device.

3. The method of claim 1, wherein the determining whether the user device is authorized to access the power source is further based on determining whether devices categorized in a category of the user device are authorized to access the power source.

4. The method of claim 1, wherein the determining whether the user device is authorized to access the power source is further based on determining, based on the expected power consumption of the user device, whether a circuit of the power source would be overloaded if the user device is granted access to the power source.

5. The method of claim 1, wherein the expected power consumption of the user device comprises a rated power consumption of the user device or a historical power consumption of the user device.

6. The method of claim 1, wherein the determining whether the user device is authorized to access the power source is further based on determining whether the expected power consumption of the user device exceeds a threshold power consumption.

7. The method of claim 1, wherein the computing device comprises a power outlet or a charger, and wherein the receiving the device profile associated with the user device is based on the user device being connected to the power outlet or the charger.

8. A method comprising:
    receiving, by a computing device and from a user device, a device profile associated with the user device, wherein the device profile associated with the user device indicates a device identifier of the user device;
    determining, by the computing device and based on the device identifier of the user device, whether the user device is authorized to access a power source; and
    granting, based on determining that the user device is authorized to access the power source, the user device access to the power source.

9. The method of claim 8, wherein the device profile associated with the user device further indicates a manufacturer of the user device, and wherein the determining whether the user device is authorized to access the power source is further based on the manufacturer of the user device.

10. The method of claim 8, wherein the device profile associated with the user device further indicates a category of the user device, and wherein the determining whether the user device is authorized to access the power source is further based on the category of the user device.

11. The method of claim 8, wherein the computing device comprises a power outlet or a charger, and wherein the receiving the device profile associated with the user device comprises receiving the device profile associated with the user device based on the user device being connected to the power outlet or the charger.

12. The method of claim 8, further comprising determining, based on the device profile associated with the user device, an expected power consumption of the user device, wherein the determining whether the user device is authorized to access the power source is further based on the expected power consumption of the user device.

13. The method of claim 12, wherein the expected power consumption of the user device comprises a rated power consumption of the user device or a historical power consumption of the user device.

14. The method of claim 12, wherein the determining whether the user device is authorized to access the power source is further based on determining whether the expected power consumption of the user device exceeds a threshold power consumption.

* * * * *

UNITED STATES PATENT AND TRADEMARK OFFICE
CERTIFICATE OF CORRECTION

PATENT NO. : 10,338,113 B2
APPLICATION NO. : 15/716697
DATED : July 2, 2019
INVENTOR(S) : Haebler et al.

Page 1 of 1

It is certified that error appears in the above-identified patent and that said Letters Patent is hereby corrected as shown below:

In the Specification

Column 5, Detailed Description, Line 60:
Please delete "109," and insert --210,--

Column 14, Detailed Description, Line 50:
Delete "135" and insert --115--

Signed and Sealed this
Fourteenth Day of January, 2020

Andrei Iancu
*Director of the United States Patent and Trademark Office*